United States Patent
Yen

(10) Patent No.: US 8,606,533 B2
(45) Date of Patent: Dec. 10, 2013

(54) BATTERY GAS-GAUGE CIRCUIT AND METHOD THEREOF

(75) Inventor: Wei-Ting Yen, Taipei (TW)

(73) Assignee: Quanta Computer Inc., Tao Yuan Shien (TW)

( * ) Notice: Subject to any disclaimer, the term of this patent is extended or adjusted under 35 U.S.C. 154(b) by 539 days.

(21) Appl. No.: 12/687,974

(22) Filed: Jan. 15, 2010

(65) Prior Publication Data

US 2010/0324847 A1 Dec. 23, 2010

(30) Foreign Application Priority Data

Jun. 22, 2009 (TW) ................ 98120901 A

(51) Int. Cl.
*G01R 31/36* (2006.01)
(52) U.S. Cl.
USPC ........................................................... 702/63
(58) Field of Classification Search
USPC ........................................................... 702/63
See application file for complete search history.

(56) References Cited

U.S. PATENT DOCUMENTS

| | | | | |
|---|---|---|---|---|
| 3,500,386 A * | 3/1970 | Venning | ........................ | 341/164 |
| 5,144,218 A | 9/1992 | Bosscha | | |
| 5,451,881 A * | 9/1995 | Finger | ........................ | 324/433 |
| 6,025,695 A * | 2/2000 | Friel et al. | ........................ | 320/106 |
| 7,511,388 B2 | 3/2009 | Webb et al. | | |
| 7,531,989 B2 | 5/2009 | Maireanu | | |
| 2005/0127879 A1* | 6/2005 | Sato et al. | ........................ | 320/134 |
| 2007/0129044 A1 | 6/2007 | Chen | | |
| 2008/0278115 A1* | 11/2008 | Huggins | ........................ | 320/134 |
| 2010/0188049 A1* | 7/2010 | Haddani et al. | ........................ | 320/134 |
| 2010/0218021 A1* | 8/2010 | Ma et al. | ........................ | 713/323 |

FOREIGN PATENT DOCUMENTS

| | | |
|---|---|---|
| CN | 1051793 A | 5/1991 |
| CN | 1719273 A | 1/2006 |
| WO | WO 2009020372 A1 * | 2/2009 |

* cited by examiner

*Primary Examiner* — Manuel L Barbee
(74) *Attorney, Agent, or Firm* — Rabin & Berdo, P.C.

(57) ABSTRACT

A battery gas-gauge circuit and method thereof are provided. The battery gas-gauge circuit includes a sensing resistor, a voltage-to-current conversion circuit, a subtractor, a comparator, a logic circuit and a power-management unit. In the voltage-to-current conversion circuit, two conversion circuits thereof obtain two voltage signals according to the two ends of the sensing resistor, respectively, and convert the two voltage signals to two current signals correspondingly. The subtractor generates a current difference signal according to the two current signals. The comparator outputs a comparison signal according to the current difference signal and a current dead-band. The logic circuit outputs a logic signal according to the comparison signal and a predetermined signal. The power-management unit determines battery power according to the logic signal.

16 Claims, 3 Drawing Sheets

BATTERY GAS-GAUGE CIRCUIT AND METHOD THEREOF

This application claims the benefit of Taiwan application Serial No. 98120901, filed Jun. 22, 2009, the subject matter of which is incorporated herein by reference.

BACKGROUND OF THE APPLICATION

1. Field of the Application

The application relates in general to a battery gas-gauge circuit and a method thereof, and more particularly to a battery gas-gauge circuit and a method thereof for obtaining the battery power with high accuracy by recording the leakage current of the coupled battery.

2. Description of the Related Art

Nowadays, as the rapid development of scientific technology makes popular the electronic devices, not only the customer requests the function of electronic device, but every enterprise attempts to develop a thin and light electronic device so as to meet the expectations of customer who expects to carry it with convenience. The electronic device is, for example, a notebook. Instead of using a conventional separation way in which the notebook and the battery module are separately disposed, every enterprise uses, for example, an integration way of fixedly coupling a battery module to a notebook, so as to minimize the volume and weight of the notebook.

Integrating a conventional battery module which is separately disposed into the electronic device contributes to a reduced volume and weight. However, the battery module is not allowed to be replaced by the customer since it has fixedly coupled to the electronic device. As for the notebook integrated with the battery module, due to the coupling relationship between the battery module and electronic device, a leakage current may be generated even in such a situation that the notebook is not operated, thereby increasing power dissipation. Moreover, the leakage current is so weak, such as which is smaller than a current dead-band, that the battery module may regard it as noise and neglect it. So that, the customer doesn't understand how much real battery power the battery module have.

In this regard, if the battery module of the electronic device runs out of its battery power before being delivered to each business shop, such as being stored in a stockroom thereof, the customer who purchases this electronic device may find it gone, i.e. out of battery, and use an adaptor to recharge this electronic device. At this time, because the battery module corresponds to the status of having charged up as in its factory, the electronic device shows on its screen that the battery module is charged up. As a result, the customer may wonder for the thing that whether the electronic device or the battery module is defective product, and every enterprise will receive customer complaint frequently which influences business reputation seriously.

SUMMARY OF THE APPLICATION

The application is directed to a battery gas-gauge circuit and method thereof. The battery gas-gauge circuit includes a sensing resistor and a power-management unit. The sensing resistor is used to generate voltage signals when a current signal such as a low leakage current passes through it. The voltage signals obtained from the two ends of the sensing resistor are converted to a current difference signal. The current difference signal is compared with a current dead-band, which allows the power-management unit to record the current signal, corresponding to the leakage current, when the electronic device is operated at a power-saving mode such as a power-off mode or a suspend mode. According to the current signal, the battery power of the battery module can be obtained with high accuracy, thereby preventing the customer from wondering that whether the electronic device or battery module is a defective product, improving the problem of customer complaint, and maintaining a good business reputation.

According to a first aspect of the present application, a battery gas-gauge circuit is provided. An embodiment of the battery gas-gauge circuit includes a sensing resistor, a voltage-to-current conversion circuit, a subtractor, a comparator, a logic circuit, and a power-management unit. The voltage-to-circuit conversion circuit includes a first conversion circuit and a second conversion circuit. The first conversion circuit obtains a first voltage signal according to one of the two ends of the sensing resistor, and converts the first voltage signal to a first current signal. The second conversion circuit obtains a second voltage signal according to another one of the two ends of the sensing resistor, and converts the second voltage signal to a second current signal. The subtractor generates a current difference signal according to the first current signal and the second current signal. The comparator outputs a comparison signal according to the current difference signal and a current dead-band. The logic circuit outputs a logic signal according to the comparison signal and a predetermined signal. The power-management unit obtains battery power according to the logic signal.

According to another aspect of the present application, a method is provided for use in a battery gas-gauge circuit which includes a sensing resistor. The method includes the following steps. First, a first voltage signal is obtained according to one of the two ends of the sensing resistor, and the first voltage signal is converted to a first current signal. Also, a second voltage signal is obtained according to another one of the two ends of the sensing resistor, and the second voltage signal is converted to a second current signal. Next, a current difference signal is generated according to the first and second current signals. Following that, a comparison signal is outputted according to the current difference signal and a current dead-band. Thereafter, a logic signal is outputted according to the comparison signal and a predetermined signal. Then, battery power is obtained according to the logic signal.

The application will become apparent from the following detailed description of the preferred but non-limiting embodiments. The following description is made with reference to the accompanying drawings.

DETAILED DESCRIPTION OF THE APPLICATION

Figure 1:
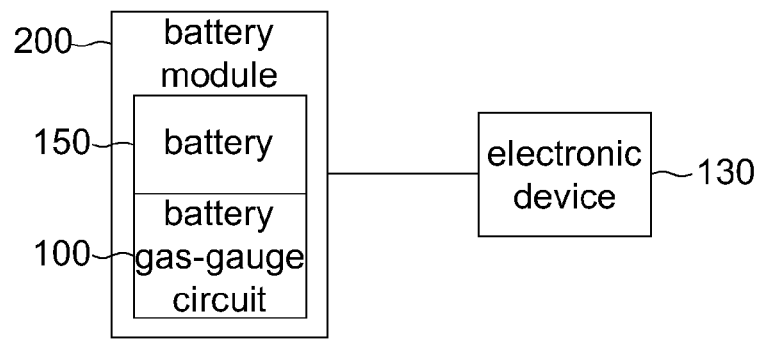
FIG. 1 is a block diagram showing a battery gas-gauge circuit being for use in a battery module according to an embodiment of the application.

In an embodiment, a battery gas-gauge circuit is provided for use in a battery module, which is disclosed below for illustration. FIG. 1 is a block diagram showing a battery gas-gauge circuit being for use in a battery module according to an embodiment of the application. As shown in FIG. 1, the battery gas-gauge circuit 100 is, for example, for use in a battery module 200. The battery module 200 includes a battery 150. The battery module 200 can power an electronic device 130 during its operation. The electronic device 130 is, for example, a notebook.

Figure 2:
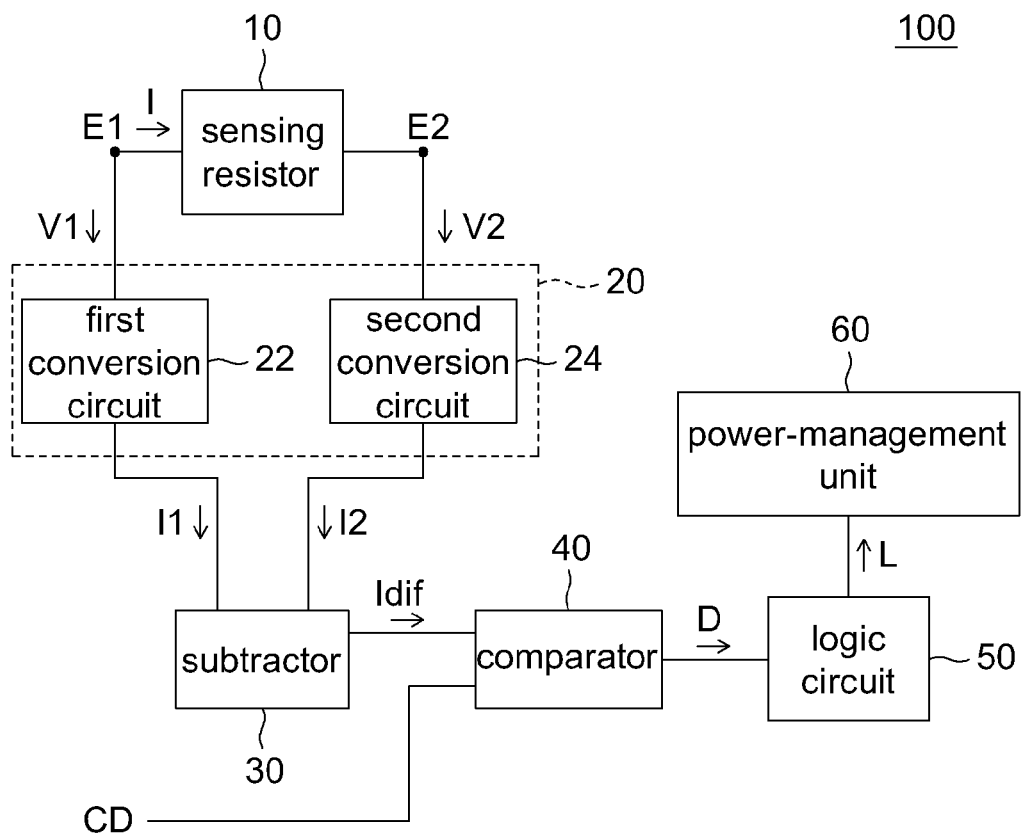
FIG. 2 is a block diagram showing the battery gas-gauge circuit in FIG. 1.
Figure 3:
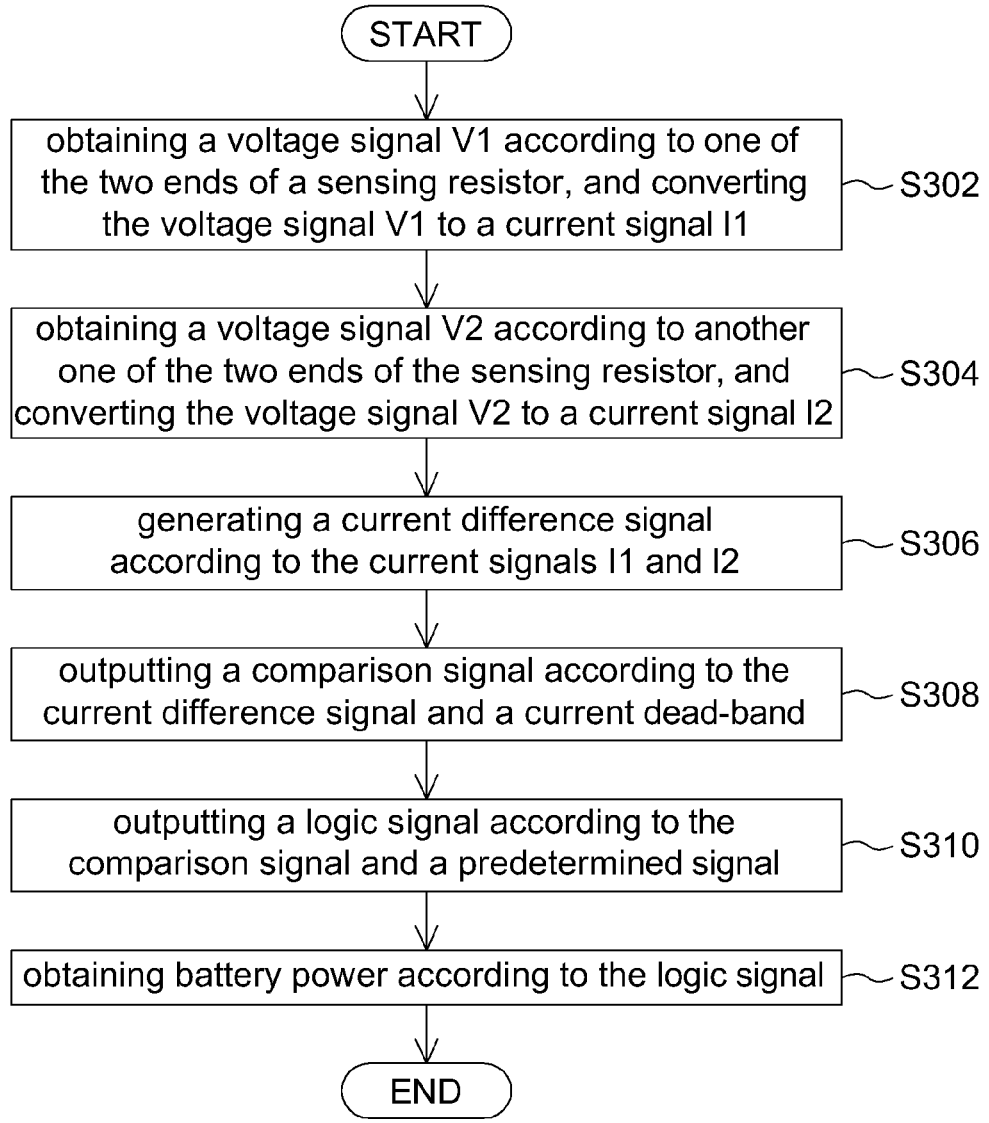
FIG. 3 is a flow chart showing a method for use in a battery gas-gauge circuit.

Refer to both of FIGS. 2 and 3. FIG. 2 is a block diagram showing the battery gas-gauge circuit in FIG. 1. FIG. 3 is a flow chart showing a method for use in a battery gas-gauge circuit. The battery gas-gauge circuit 100 includes a sensing resistor 10, a voltage-to-current conversion circuit 20, a subtractor 30, a comparator 40, a logic circuit 50, and a power-management unit 60. The voltage-to-circuit conversion circuit 20 includes a first conversion circuit 22 and a second conversion circuit 24. The voltage-to-current conversion circuit 20, the subtractor 30, the comparator 40, and the logic circuit 50 can be, for example, embodied in an integrated circuit (IC) without any intend of limitation.

The method is further provided for use in the mentioned battery gas-gauge circuit 10, which includes the following steps. In step S302, the first conversion circuit 22 obtains a voltage signal V1 according to one end E1 of the two ends of the sensing resistor 10, and converts the voltage signal V1 to a current signal I1. In step S304, the second conversion circuit 24 obtains a voltage signal V2 according to another end E2 of the two ends of the sensing resistor 10, and converts the voltage signal V2 to a current signal I2. The first conversion circuit 22 and the second conversion circuit 24 each include, for example, operational amplifiers. An example is made below for elaborating how the voltage signal is generated.

As in an example, the voltage signal V1 and the voltage signal V2 are generated from a current signal I which passes through the sensing resistor 10. The current signal I is, for example, the leakage current of the battery module, and the leakage current is at relatively low level. For example, when the electronic device 130 is operated in a power-saving mode, because the battery 150 of the battery module 200 still is coupled with the electronic device 130, a circuit loop is formed therein. As such, due to the formed circuit loop between the battery 150 and the electronic device 130, the battery 150 regards the electronic device 130 as a load for discharging, and the generated current in the circuit loop is, for example, the leakage current. The power-saving mode can be, for example, a power-off mode or a suspend mode, and the leakage currents which the battery module 200 generate at different modes may be different from each other.

In step S306, the subtractor 30 generates a current difference signal Idif according to the first current signal I1 and the second current signal I2. The current difference signal Idif corresponds to the current signal I such as the leakage current.

In step S308, the comparator 40 outputs a comparison signal D according to the current difference signal Idif and a current dead-band CD. In a conventional battery gas-gauge approach, the current lower than the current dead-band CD is referred to as noises and neglected, thereby failing to precisely record the status of leakage current of the battery 150, and making it impossible to obtain the real battery power of the battery 150. The current dead-band is, for example, 3 mA.

Specifically, the embodiment employs the comparator 40 to determine whether the current difference signal Idif is higher or lower than the current dead-band CD. For example, when the current difference signal Idif is higher than the current dead-band CD, the comparator 40 outputs, for example, a comparison signal D with higher level. Correspondingly, when the current difference signal Idif is lower than the current dead-band CD, the comparator 40 outputs, for example, the comparison signal D with lower level.

In step S310, the logic circuit 50 outputs a logic signal L according to the comparison signal D and a predetermined signal P. The predetermined signal P is outputted from an enable pin of a charge integrated circuit, which is included in the battery module 200 for example. In step S312, the power-management unit 60 obtains battery power according to the logic signal L. An example will be made below for further description about the steps S310~S312.

As in an example, prior to the deliver of the electronic device 130 from its factory, personnel of every enterprise can use application program to enable the enable pin of charge integrated circuit before the electronic device 130 enters a power-saving mode, so as to configure the predetermined signal P. The predetermined signal is, for example, previously configured as having an enable level, such as a high level, and the enable level is, for example, configured before the electronic device 130 enters the power-saving mode.

As such, when the predetermined signal P has the enable level and the comparison signal D has high level for example, the logic circuit 50 outputs a logic signal L according to the predetermined signal P and the comparison signal D. The logical signal L has, for example, high level. The power-management unit 60 obtains the battery power of the battery 150 according to the logic signal L with high level.

For example, the power-management unit 60 first records the current signal I, and performs calculation according to the recorded current signal I and a predetermined data thereafter, so as to obtain the battery power of the battery 150. The current signal I can be, for example, recorded in the power-management unit 60, or recorded in the battery module 200. The predetermined data can, for example, correspond to the value of current which the electronic device 130 consumes in the power-off mode or suspend mode, such as the values of 1.47 mA or 3.01 mA.

Figure 4:
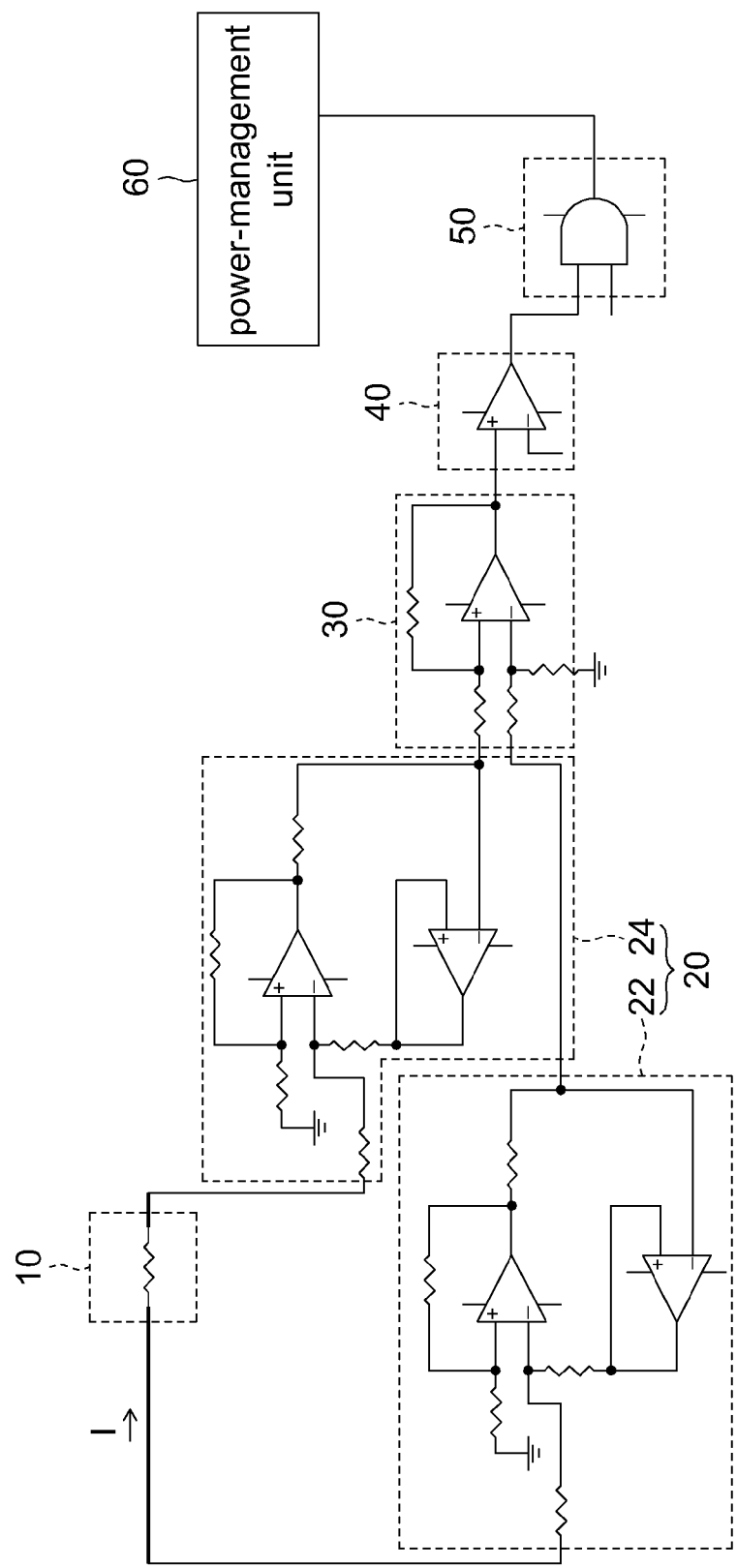
FIG. 4 is a circuit diagram showing an embodiment of the battery gas-gauge circuit in FIG. 1.

In a different example, however, the power-saving mode can also be the suspend mode. Corresponding to the electronic device which is operated at different power-saving modes, the levels of leakage currents which the battery module 200 can generate are different from each other. Moreover, with respect to different electronic devices the levels of leakage currents which the battery module can generate are further different from each other. Therefore, in practical, the above-mentioned predetermined data can be obtained in accordance with different application situation. FIG. 4 is a circuit diagram showing an embodiment of the battery gas-gauge circuit in FIG. 1.

Specifically, when the electronic device 130 leaves the power-saving mode right after being started, the application programs of electronic device 130 can configure the predetermined signal P as having a low-level predetermined signal P. In this situation, the logic circuit 50 will not output the high-level logic signal L according to the predetermined signal P and the comparison signal D. In other words, the power-management unit can stop recording the current signal I, and can further delete the recorded current signal I for example.

After the electronic device 130 is started, the currents signal I is usually greater than the current dead-band CD. In this regard, the comparator 40 will not output a high-level comparison signal D. In other words, no matter whether the predetermined signal P has high level or not, the logic circuit 50 stops for outputting the high-level logic signal L. Therefore, it is practicable to monitor the battery gas-gauge circuit 100 and allow it to operate properly and accordingly, thereby preventing the battery gas-gauge circuit 100 from being affected when the application program of electronic device 130 is erroneously enabled. Erroneously enabling the application program means that the electronic device 130 generates a predetermined signal P with enabled level when it is not operated at power-saving status.

As in another example, when a customer no more uses the electronic device 130 and turns it off, the application program of electronic device 130 can actively enable the enable pin of the charge integrated circuit, so that the predetermined signal P is at its enable level. Thereafter, executing the above-mentioned way of battery power obtaining, the battery gas-gauge circuit 100 can also obtain the battery power of battery 150 in the battery module 200 when the electronic device 130 is turned off, i.e., the electronic device is operated at power-saving mode. Therefore, the battery power of battery 150 can be obtained with high accuracy. However, the mentioned method for use in the batter gas-gauge circuit can be executed when the battery 150 is at normal status, such as the pre-charge mode or the normal mode.

According to the embodiments of the application, the battery gas-gauge circuit and method thereof have the following exemplary advantages:

(1) a mentioned embodiment can obtain, with high accuracy, the battery power of a battery which is coupled to an electronic device, and provide reliable battery power, thereby preventing the customer from wondering that whether the electronic device or battery is a defective product, improving the problem of customer complaint, and maintaining a good business reputation;

(2) in addition, as shown in a mentioned embodiment, the battery gas-gauge circuit can monitor the battery gas-gauge circuit and allow it to operate properly and accordingly, thereby preventing the battery gas-gauge circuit from an erroneous action of obtaining batter power for the electronic device which is not operated at power-saving mode, and avoiding unnecessary power dissipation.

While the application has been described by way of example and in terms of a preferred embodiment, it is to be understood that the application is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A battery gas-gauge circuit for measuring battery power of a battery of an electronic device, comprising:
   a sensing resistor, wherein a first voltage signal and a second voltage signal at two ends of the sensing resistor are in response to a battery current between the battery and the sensing resistor;
   a voltage-to-current conversion circuit for converting the first voltage signal and the second voltage signal to a first current signal and a second current signal, respectively;
   a determination circuit for determining whether the battery current is a leakage current, based on the first current signal, the second current signal, a current dead-band and an operation mode of the electronic device; and
   a power-management unit for recording the battery current and obtaining the battery power of the battery according to the battery current and a power-saving mode current, in response to the determination circuit determining that the battery current is a leakage current;
   wherein the operation mode of the electronic device corresponds to a predetermined signal, and the predetermined signal causes the power-management unit to stop recording the battery current when the electronic device leaves a power saving mode.

2. The battery gas-gauge circuit according to claim 1, wherein the predetermined signal is outputted from an enable pin of a charge integrated circuit.

3. The battery gas-gauge circuit according to claim 2, wherein the predetermined signal is previously configured to an enable level.

4. The battery gas-gauge circuit according to claim 2, wherein the predetermined signal is previously configured to an enable level in the power-saving mode.

5. The battery gas-gauge circuit according to claim 4, wherein the power-saving mode is a suspend mode.

6. The battery gas-gauge circuit according to claim 4, wherein the power-saving mode is a power-off mode.

7. The battery gas-gauge circuit according to claim 1, wherein the voltage-to-current conversion circuit comprises:
   a first conversion circuit, for converting the first voltage signal to the first current signal; and
   a second conversion circuit, for converting the second voltage signal to the second current signal.

8. The battery gas-gauge circuit according to claim 1, wherein the determination circuit comprises:
   a subtractor for generating a current difference signal according to the first current signal and the second current signal;
   a comparator for outputting a comparison signal according to the current difference signal and a current dead-band; and
   a logic circuit for outputting a logic signal according to the comparison signal and the predetermined signal.

9. The battery gas-gauge circuit according to claim 8, wherein the voltage-to-current conversion circuit, the subtractor, the comparator, and the logic circuit are embodied in an integrated circuit (IC).

10. A method for use in a battery gas-gauge circuit which measures battery power of a battery of an electronic device, the battery gas-gauge circuit including a sensing resistor, the method comprising:
    obtaining a first voltage signal and a second voltage signal at two ends of the sensing resistor in response to a battery current between the battery and the sensing resistor;
    converting the first voltage signal and the second voltage signal to a first current signal and a second current signal, respectively;
    determining whether the battery current is a leakage current based on the first current signal, the second current signal, a current dead-band and an operation mode of the electronic device; and
    recording the battery current and obtaining the battery power of the battery according to the battery current and a power-saving mode current in response to a determination in said determining step that the battery current is a leakage current,
    wherein the operation mode of the electronic device corresponds to a predetermined signal, and the predetermined signal causes recording of the battery current to stop when the electronic device leaves the power saving mode.

11. The method for use in the battery gas-gauge circuit according to claim 10, wherein the predetermined signal is outputted from an enable pin of a charge integrated circuit.

12. The method for use in the battery gas-gauge circuit according to claim 11, wherein the predetermined signal is previously configured to an enable level.

13. The method for use in the battery gas-gauge circuit according to claim 11, wherein the predetermined signal is previously configured to an enable level in the power-saving mode.

14. The method for use in the battery gas-gauge circuit according to claim 13, wherein the power-saving mode is a suspend mode.

15. The method for use in the battery gas-gauge circuit according to claim 13, wherein the power-saving mode is a power-off mode.

16. The method for use in the battery gas-gauge circuit according to claim 10, wherein the step of determining whether the battery current is a leakage current further comprises:
- generating a current difference signal according to the first current signal and the second current signal;
- outputting a comparison signal according to the current difference signal and a current dead-band; and
- outputting a logic signal according to the comparison signal and the predetermined signal.

* * * * *